(12) United States Patent
Chito (10) Patent No.: US 10,910,246 B2
(45) Date of Patent: Feb. 2, 2021

(54) HOLD CHECKING METHOD AND UNHOLD CHECKING METHOD FOR WAFER

(71) Applicant: DISCO CORPORATION, Tokyo (JP)

(72) Inventor: Kenta Chito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 413 days.

(21) Appl. No.: 15/648,663

(22) Filed: Jul. 13, 2017

(65) Prior Publication Data

US 2018/0025928 A1 Jan. 25, 2018

(30) Foreign Application Priority Data

Jul. 20, 2016 (JP) .................................. 2016-142216

(51) Int. Cl.
| | |
|---|---|
| *H01L 21/683* | (2006.01) |
| *H01L 21/677* | (2006.01) |
| *H01L 21/67* | (2006.01) |
| *H01J 37/32* | (2006.01) |

(52) U.S. Cl.
CPC .. *H01L 21/67259* (2013.01); *H01J 37/32009* (2013.01); *H01J 37/32697* (2013.01); *H01J 37/32715* (2013.01); *H01J 37/32733* (2013.01); *H01J 37/32935* (2013.01); *H01L 21/67069* (2013.01); *H01L 21/67742* (2013.01); *H01L 21/6831* (2013.01); *H01L 21/6833* (2013.01); *H01J 2237/334* (2013.01)

(58) Field of Classification Search
CPC ......... H01J 37/32697; H01L 21/67742; H01L 21/6831; H01L 21/6833; H01L 21/67069
See application file for complete search history.

(56) References Cited

U.S. PATENT DOCUMENTS

| 2006/0215338 A1* | 9/2006 | Yokouchi | .......... H01L 21/67253 361/56 |
|---|---|---|---|
| 2009/0053836 A1* | 2/2009 | Pipitone | ............ H01J 37/32091 438/10 |
| 2014/0091232 A1* | 4/2014 | Ohsawa | .............. H01L 21/6831 250/442.11 |
| 2016/0276199 A1* | 9/2016 | Iida | ..................... H01L 21/6833 |

FOREIGN PATENT DOCUMENTS

JP 2001-358097 12/2001

* cited by examiner

*Primary Examiner* — Elizabeth A Burkhart (74) *Attorney, Agent, or Firm* — Greer, Burns & Crain, Ltd.

(57) ABSTRACT

Disclosed herein is a hold checking method for checking whether or not a wafer is held by an electrostatic chuck in loading the wafer to the electrostatic chuck by operating a transfer unit holding the wafer. The hold checking method includes a connecting step of bringing the wafer held by a transfer pad into contact with the electrostatic chuck to thereby connect the transfer pad through the wafer to the electrostatic chuck, and a hold determining step of supplying electric power from a DC power source through first wiring to the electrostatic chuck after performing the connecting step, and next determining that the wafer is held by the electrostatic chuck when the voltage across a resistor inserted in the first wiring has reached a predetermined voltage value.

4 Claims, 6 Drawing Sheets

HOLD CHECKING METHOD AND UNHOLD CHECKING METHOD FOR WAFER

BACKGROUND OF THE INVENTION

Field of the Invention

The present invention relates to a hold checking method for checking whether or not a wafer is held by an electrostatic chuck, an unhold checking method for checking whether or not the wafer is unheld from the electrostatic chuck, and a vacuum processing apparatus for processing the wafer in a vacuum environment.

Description of the Related Art

A wafer such as a semiconductor wafer is ground by a grinding apparatus to reduce the thickness of the wafer to a predetermined thickness. Thereafter, the wafer is divided into individual device chips by using a cutting apparatus, for example. The device chips are used in various electronic equipment or the like. In grinding the wafer, a protective tape is previously attached to the front side of the wafer on which a plurality of devices are formed. The wafer is held on a holding table in the condition where the protective tape attached to the front side of the wafer is in contact with the holding table. Thereafter, a grinding wheel is rotated and brought into pressure contact with the back side of the wafer, thereby grinding the back side of the wafer. There is a case that a grinding mark may be left on the back side of the wafer in grinding the back side of the wafer. When the wafer is divided into device chips in the condition where the grinding mark is left, there is a problem such that the die strength of each device chip obtained may be reduced.

To solve this problem, there has been proposed a method of removing the grinding mark formed on the back side of the wafer to improve the die strength of each device chip, by using a plasma etching apparatus to perform plasma etching to the back side of the wafer in a vacuum environment (see Japanese Patent Laid-open No. 2001-358097, for example).

SUMMARY OF THE INVENTION

The plasma etching apparatus as described in Japanese Patent Laid-open No. 2001-358097 includes a vacuum chamber in which the plasma etching is performed. In performing the plasma etching, a door of the vacuum chamber is opened to load the wafer into the vacuum chamber. After closing the door, the vacuum chamber is evacuated and an etching gas is next supplied into the vacuum chamber. Thereafter, the etching gas is dissociated to form a plasma. The plasma functions to etch the back side of the wafer. Accordingly, the grinding mark is removed from the back side (work surface) of the wafer.

In the case that a chuck table for holding the wafer is of a type such that the wafer is held under suction on the chuck table, it is difficult to reliably hold the wafer on the chuck table under suction in the vacuum chamber evacuated. Accordingly, in the case of holding the wafer in the vacuum chamber evacuated, an electrostatic chuck is provided in the vacuum chamber. The electrostatic chuck has a holding surface for holding the wafer. A voltage is applied between the holding surface and the wafer to produce an electrostatic force therebetween, thereby electrostatically holding the wafer on the holding surface.

A chuck table of the type holding the wafer under suction is provided in a processing apparatus such as a cutting apparatus capable of processing the wafer under atmospheric pressure. That is, this chuck table is not surrounded by a vacuum chamber enclosed. Accordingly, a suction force of holding the wafer on the holding surface of the chuck table can be directly checked, so that it is possible to easily check whether or not the wafer is held by the chuck table. In contrast, in the case that the wafer is held by the electrostatic chuck provided in the enclosed and evacuated vacuum chamber in the plasma etching apparatus, it is not easy to check whether or not the wafer is sufficiently held by the electrostatic chuck. If plasma etching is started in the condition where the wafer is not sufficiently held by the electrostatic chuck, there is a possibility of arcing (abnormal discharge) or tape burning caused by the discharge in a spacing between the holding surface of the electrostatic chuck and the protective tape attached to the wafer. As a result, there arises a problem such that the plasma etching apparatus may be troubled or the wafer may be greatly damaged.

Further, in unloading the wafer from the vacuum chamber by using a transfer pad after performing the plasma etching, the transfer pad is brought into contact with the wafer held by the electrostatic chuck and the wafer is then held by the transfer pad under suction. Thereafter, the electrostatic holding of the wafer by the electrostatic chuck is canceled. At this time, if the transfer pad is raised in the condition where the electrostatic holding of the wafer by the electrostatic chuck is not sufficiently canceled, the wafer may be pulled in opposite directions by the transfer pad and the electrostatic chuck, causing damage to the wafer.

Accordingly, in the case of using a vacuum processing apparatus such as a plasma etching apparatus to process the wafer in a vacuum environment, it is necessary for the vacuum processing apparatus to easily check whether or not the wafer is sufficiently held by the electrostatic chuck in loading the wafer to the electrostatic chuck. Further, it is also necessary for the vacuum processing apparatus to easily check whether or not the wafer is sufficiently unheld from the electrostatic chuck in unloading the wafer from the electrostatic chuck. In summary, it is necessary to easily check the hold/unhold condition of the wafer by the electrostatic chuck in the vacuum processing apparatus.

It is therefore an object of the present invention to provide a hold checking method which can check whether or not the wafer is sufficiently held by the electrostatic chuck provided in a vacuum processing apparatus in loading the wafer to the electrostatic chuck.

It is another object of the present invention to provide an unhold checking method which can check whether or not the wafer is sufficiently unheld from the electrostatic chuck in unloading the wafer from the electrostatic chuck.

In accordance with an aspect of the present invention, there is provided in a vacuum processing apparatus including an electrostatic chuck including a wafer holding portion having a holding surface formed of a dielectric for holding a wafer, a metal plate provided in the wafer holding portion, and first wiring for connecting the metal plate to a direct current (DC) power source; transfer means including a transfer pad having a holding surface formed of a conductor for holding the wafer and second wiring for grounding the transfer pad; and voltage measuring means having a resistor inserted in the first wiring and a voltmeter for measuring a voltage across the resistor; a hold checking method for checking whether or not the wafer is held by the electrostatic chuck in loading the wafer to the electrostatic chuck by operating the transfer means holding the wafer, the hold checking method including a connecting step of bringing the wafer held by the transfer pad into contact with the electrostatic chuck to thereby connect the transfer pad through the wafer to the electrostatic chuck; and a hold determining step of supplying electric power from the DC power source to the electrostatic chuck after performing the connecting step, and next determining that the wafer is held on the holding surface of the electrostatic chuck when the voltage across the resistor as measured by the voltmeter has reached a predetermined voltage value.

In accordance with another aspect of the present invention, there is provided in a vacuum processing apparatus including an electrostatic chuck including a wafer holding portion having a holding surface formed of a dielectric for holding a wafer, a metal plate provided in the wafer holding portion, and first wiring for connecting the metal plate to a DC power source; transfer means including a transfer pad having a holding surface formed of a conductor for holding the wafer and second wiring for grounding the transfer pad; and voltage measuring means having a resistor inserted in the second wiring and a voltmeter for measuring a voltage across the resistor; an unhold checking method for checking whether or not the wafer is unheld from the electrostatic chuck in unloading the wafer from the electrostatic chuck by operating the transfer means holding the wafer, the unhold checking method including a connecting step of bringing the transfer pad into the wafer held by the electrostatic chuck to thereby connect the transfer pad through the wafer to the electrostatic chuck; and an unhold determining step of stopping the supply of electric power from the DC power source to the electrostatic chuck after performing the connecting step, and next determining that the wafer is unheld from the holding surface of the electrostatic chuck when the voltage across the resistor as measured by the voltmeter has reached a predetermined voltage value.

In accordance with a further aspect of the present invention, there is provided a vacuum processing apparatus for processing a wafer in a vacuum environment, the vacuum processing apparatus including an electrostatic chuck having a holding surface for holding the wafer; a vacuum chamber connected to evacuating means, the electrostatic chuck being provided in the vacuum chamber; and transfer means for loading the wafer into the vacuum chamber and unloading the wafer from the vacuum chamber; the electrostatic chuck including a wafer holding portion formed of a dielectric, a metal plate provided in the wafer holding portion so as to be arranged parallel to the holding surface, and first wiring for connecting the metal plate to a DC power source; the transfer means including a transfer pad having a holding surface formed of a conductor for holding the wafer and second wiring for grounding the transfer pad; the vacuum processing apparatus further including voltage measuring means having a resistor inserted in the first wiring or the second wiring and a voltmeter for measuring a voltage across the resistor; and control means connected to the voltage measuring means; the control means having a first determining section for determining that the wafer is held on the holding surface of the electrostatic chuck when electric power is supplied from the DC power source to the electrostatic chuck in the condition where the transfer pad is connected through the wafer to the electrostatic chuck, and the voltage across the resistor as measured by the voltmeter has reached a first predetermined voltage value; and a second determining section for determining that the wafer is unheld from the holding surface of the electrostatic chuck when the supply of electric power from the DC power to the electrostatic chuck is stopped and the voltage across the resistor as measured by the voltmeter has reached a second predetermined voltage value.

According to the hold checking method of the present invention, the following effect can be obtained. Even in the case that wafer is loaded to the electrostatic chuck included in the vacuum processing apparatus, that is, even in the case that it is difficult for a processing apparatus to determine whether or not the wafer is sufficiently held by the electrostatic chuck, the vacuum processing apparatus according to the present invention can easily determine whether or not the wafer is sufficiently held by the electrostatic chuck.

According to the unhold checking method of the present invention, the following effect can be obtained. Even in the case that the wafer is unloaded from the electrostatic chuck included in the vacuum processing apparatus, that is, even in the case that it is difficult for a processing apparatus to determine whether or not the wafer is sufficiently unheld from the electrostatic chuck, the vacuum processing apparatus according to the present invention can easily determine whether or not the wafer is sufficiently unheld from the electrostatic chuck.

The above and other objects, features and advantages of the present invention and the manner of realizing them will become more apparent, and the invention itself will best be understood from a study of the following description and appended claims with reference to the attached drawings depicting a preferred embodiment of the invention.

DETAILED DESCRIPTION OF THE PREFERRED EMBODIMENT

Figure 1:
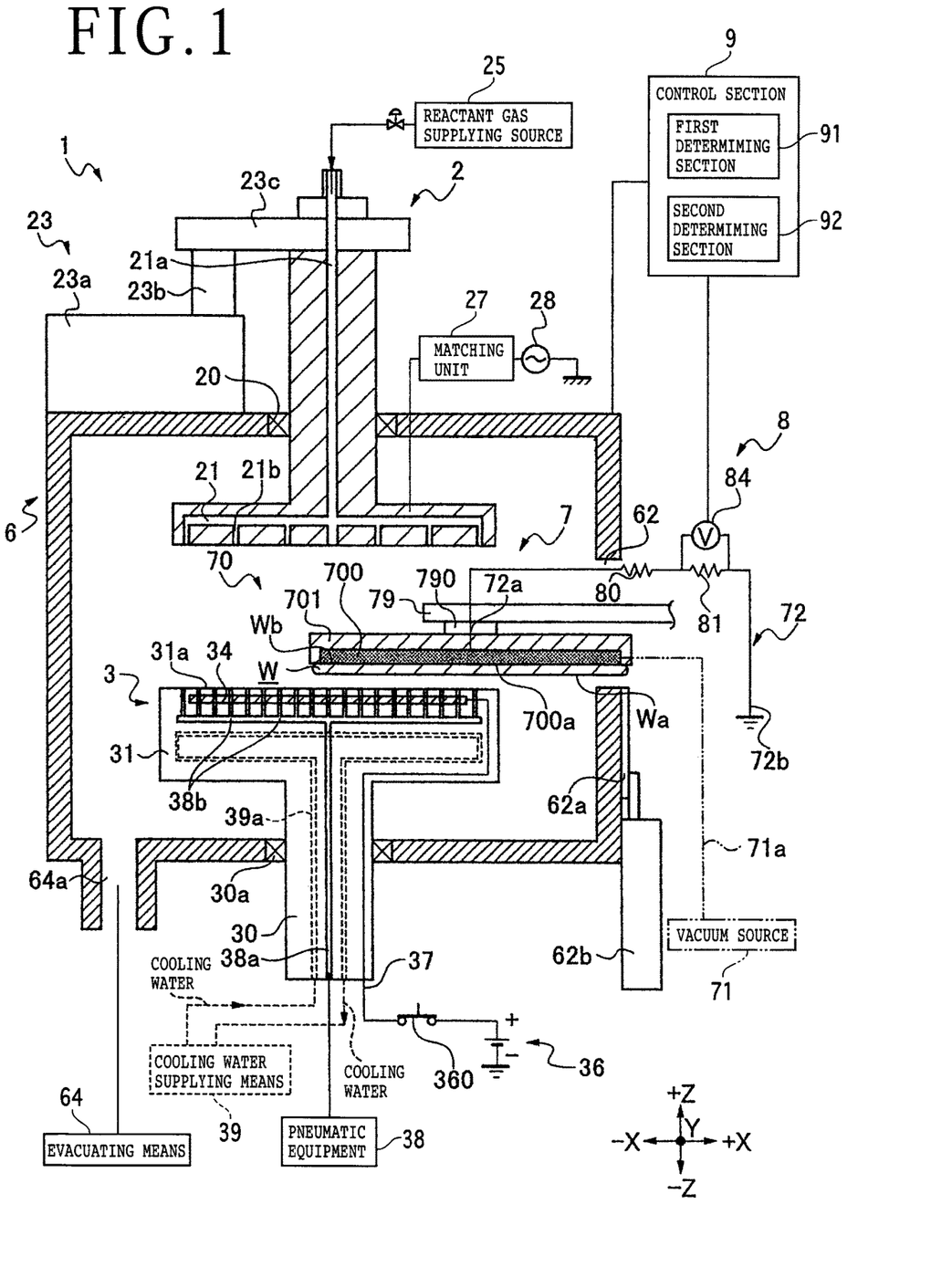
FIG. 1 is a vertical sectional view depicting a vacuum processing apparatus according to a preferred embodiment of the present invention.

Referring to FIG. 1, there is depicted a vacuum processing apparatus 1 for processing a wafer W in a vacuum environment (under a reduced pressure). The vacuum processing apparatus 1 depicted in FIG. 1 is a plasma etching apparatus including an electrostatic chuck 3 having a holding surface 31a for holding the wafer W, a vacuum chamber 6 equipped with evacuating means 64 for evacuating the inside space of the vacuum chamber 6 in which the electrostatic chuck 3 is provided, and transfer means 7 for loading the wafer W into the vacuum chamber 6 and unloading the wafer W out of the vacuum chamber 6. The vacuum processing apparatus 1 according to the present invention is not limited to such a plasma etching apparatus.

The electrostatic chuck 3 includes a shaft portion 30 rotatably supported through a bearing 30a to a lower portion of the vacuum chamber 6 and a wafer holding portion 31 formed of a dielectric such as ceramic (e.g., alumina and titanium oxide). As depicted in FIG. 1, the electrostatic chuck 3 has a substantially T shape in vertical section. The wafer holding portion 31 is a disk-shaped portion, and it is integrally connected to the upper end of the shaft portion 30. That is, the wafer holding portion 31 is integral with the shaft portion 30. The upper surface of the wafer holding portion 31 functions as a holding surface 31a formed of a dielectric for holding the wafer W. The wafer holding portion 31 may be configured by forming a dielectric film such as a ceramic film on a separate member.

As depicted by a broken line, a cooling water passage 39a for passing a cooling water is formed inside the shaft portion 30 and the wafer holding portion 31. Cooling water supplying means 39 is connected to the cooling water passage 39a, so as to supply a cooling water to the cooling water passage 39a and thereby cool the inside of the electrostatic chuck 3. In the case that a protective tape (not depicted) is attached to the wafer W as a workpiece to be processed, the cooling water supplied from the cooling water supplying means 39 can maintain the temperature of the holding surface 31a of the electrostatic chuck 3 at a temperature such that no gas is generated from the protective tape during plasma etching.

A metal plate 34 as an electrode for generating electrical charge by applying a voltage is embedded in the electrostatic chuck 3. The metal plate 34 is a circular plate provided parallel to the holding surface 31a. The metal plate 34 is connected through first wiring 37 to the plus terminal of a DC power source 36. Accordingly, when a high DC voltage is applied from the DC power source 36 to the metal plate 34, electrical charge (static electricity) due to plarization is generated on the holding surface 31a, so that the wafer W can be electrostatically held on the holding surface 31a by a Coulomb force.

As depicted in FIG. 1, an air passage 38a is formed in the shaft portion 30, and pneumatic equipment 38 composed of a vacuum generating apparatus and a compressor is connected to the lower end of the air passage 38a. The pneumatic equipment 38 functions both as a vacuum source for generating a suction force on the holding surface 31a and as an air source for supplying pressurized air to the holding surface 31a. The air passage 38a extends to the wafer holding portion 31 and is branched into a plurality of short passages 38b inside the wafer holding portion 31. Each short passage 38b branched from the air passage 38a extends through the metal plate 34 in the thickness direction thereof (Z direction), and the upper end of each short passage 38b opens to the holding surface 31a of the electrostatic chuck 3.

A gas discharge head 2 for discharging a reactant gas (etching gas) is vertically movably supported through a bearing 20 to an upper portion of the vacuum chamber 6. A gas diffusion space 21 is defined inside the gas discharge head 2. A gas inlet passage 21a is connected to an upper portion of the gas diffusion space 21, and a plurality of gas outlet passages 21b are connected to a lower portion of the gas diffusion space 21. The lower end of each gas outlet passage 21b opens to the lower surface of the gas discharge head 2 so as to be directed toward the electrostatic chuck 3. An air cylinder 23 is connected to the gas discharge head 2, so as to vertically move the gas discharge head 2. The air cylinder 23 includes a cylinder tube 23a containing a piston (not depicted) and having a bottom at the lower end (at a base end in the −Z direction) which is fixed to the upper surface of the vacuum chamber 6, a piston rod 23b inserted in the cylinder tube 23a and having one end fixed to the piston, and a connecting member 23c fixed to the other end of the piston rod 23b for supporting the gas discharge head 2. When air is supplied to the cylinder tube 23a or discharged from the cylinder tube 23a, the pressure inside the cylinder tube 23a is changed to thereby vertically move the piston rod 23b in the Z direction. As a result, the gas discharge head 2 is vertically moved.

A reactant gas supplying source 25 is connected to the gas inlet passage 21a formed inside the gas discharge head 2. For example, the reactang gas supplying source 25 contains a fluorine-based gas such as $SF_6$, $CF_4$, $C_2F_6$, and $C_2F_4$ as the reactant gas. In addition to the reactant gas supplying source 25, an assist gas source (not depicted) containing an assist gas for assisting a plasma etching reaction may be connected to the gas inlet passage 21a. In this case, a rare gas such as Ar and He is contained as the assist gas in the assist gas source.

A radio frequency (RF) power source 28 is connected through a matching unit 27 to the gas discharge head 2. By supplying an RF power from the RF power source 28 through the matching unit 27 to the gas discharge head 2, the gas discharged from the gas outlet passages 21b can be dissociated to form a plasma.

The vacuum chamber 6 has a side wall portion formed formed with a load/unload opening 62 for loading and unloading the wafer W. A shutter 62a for closing the load/unload opening 62 is movably provided on the outer surface of the side wall portion of the vacuum chamber 6. The shutter 62a is adapted to be vertically moved by shutter moving means 62b such as an air cylinder.

The lower portion of the vacuum chamber 6 is formed with an evacuation opening 64a, which is connected to evacuating means 64 for reducing the pressure inside the vacuum chamber 6. Accordingly, by operating the evacuating means 64, the pressure inside the vacuum chamber 6 can be reduced to a predetermined degree of vacuum.

The transfer means 7 depicted in FIG. 1 includes a transfer pad 70 having a circular outside shape, for example. The transfer pad 70 includes a suction holding member 700 for holding the wafer W under suction, the suction holding member 700 being formed of a conductive porous material such as carbon porous material and metal porous material, and a frame member 701 for supporting the suction holding member 700. A suction line 71a is connected at one end thereof to the suction holding member 700. The other end of the suction line 71a is connected to a vacuum source 71 such as a vacuum generating apparatus and a compressor. The suction holding member 700 has a lower surface as a conductive holding surface 700a, which is an exposed surface flush with the upper surface of the frame member 701. When the vacuum source 71 is operated to generate a suction force, this suction force is transmitted through the suction line 71a to the holding surface 700a of the suction holding member 700, so that the wafer W can be held under suction by the holding surface 700a of the suction holding member 700 included in the transfer pad 70.

A connecting member 790 is fixed at a lower end thereof to the upper surface of the frame member 701 of the transfer pad 70, and an arm 79 is fixed at one end portion thereof to the upper end of the connecting member 790. That is, the upper end of the connecting member 790 is fixed to the lower surface of the arm 79. Accordingly, the transfer pad 70 is fixed through the connecting member 790 to the arm 79. The arm 79 is movable or rotatable in a horizontal plane and also vertically movable in the Z direction.

The transfer means 7 further includes second wiring 72 for connecting the transfer pad 70 to the ground. The second wiring 72 is grounded at one end 72b and connected at the other end 72a to the suction holding member 700 of the transfer pad 70.

Figure 2:
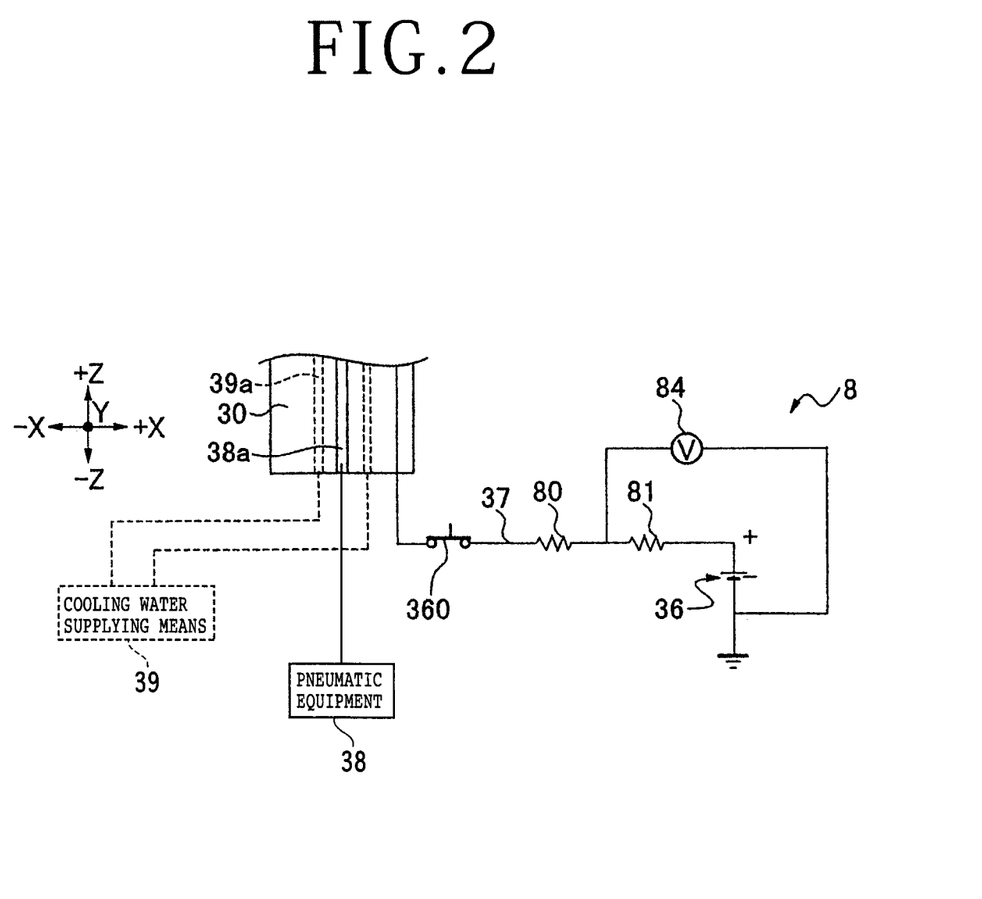
FIG. 2 is a schematic view depicting a modification such that voltage measuring means is provided in connection with first wiring.

As depicted in FIG. 1, a resistor 80 and a resistor 81 are connected in series with the second wiring 72, and a voltmeter 84 for measuring a voltage across the resistor 81 is connected in parallel to the resistor 81. The resistors 80 and 81 and the voltmeter 84 constitute voltage measuring means 8. The configuration of the voltage measuring means 8 is not limited to the above configuration. For example, any resistor other than the resistors 80 and 81 may be provided. Further, the resistors 80 and 81 and the voltmeter 84 may be connected to the first wiring 37 rather than the second wiring 72 as depicted in FIG. 2.

As depicted in FIG. 1, the vacuum processing apparatus 1 further includes a control section 9 configured by a central processing unit (CPU), storage device such as memory, etc. The control section 9 controls various etching conditions including the amount of the etching gas to be discharged, the time duration of discharge of the etching gas, and the RF power to be applied. The control section 9 includes a first determining section 91 for determining whether or not the wafer W is held on the holding surface 31a of the electrostatic chuck 3 (i.e., whether or not the electrostatic holding of the wafer W by the electrostatic chuck 3 has been established) and a second determining section 92 for determining whether or not the wafer W is unheld from the holding surface 31a of the electrostatic chuck 3 (i.e., whether or not the electrostatic holding of the wafer W by the electrostatic chuck 3 has been canceled). A voltage applied to the resistor 81 is measured by the voltmeter 84, and information on this voltage measured by the voltmeter 84 is transmitted to the control section 9.

The operation of the vacuum processing apparatus 1 depicted in FIG. 1 will now be described in the case of performing processing (plasma processing in this preferred embodiment) to the wafer W in a vacuum environment. For example, the wafer W is a semiconductor wafer having a circular outside shape. The wafer W has a front side Wa on which a plurality of devices are previously formed and a back side Wb opposite to the front side Wa. The back side Wb of the wafer W is a work surface to be plasma-etched. A protective tape (not depicted) may be attached to the front side Wa of the wafer W, so as to protect the devices.

Prior to loading the wafer W into the vacuum chamber 6 by using the transfer means 7, the arm 79 is operated to move the transfer pad 70 in a horizontal plane and thereby position the transfer pad 70 directly above the wafer W outside the vacuum chamber 6 in such a manner that the center of the transfer pad 70 substantially coincides with the center of the back side Wb of the wafer W. Thereafter, the arm 79 is lowered in the −Z direction until the holding surface 700a of the transfer pad 70 comes into contact with the back side Wb of the wafer W. Thereafter, the vacuum source 71 is operated to apply a vacuum to the holding surface 700a of the transfer pad 70, thereby holding the wafer W on the holding surface 700a under suction as depicted in FIG. 1.

Thereafter, the transfer means 7 is operated to load the wafer W into the vacuum chamber 6 and set the wafer W on the electrostatic chuck 3. At this time, a hold checking method according to this preferred embodiment is performed to check whether or not the wafer W is electrostatically held by the electrostatic chuck 3. That is, the hold checking method is performed to prevent the possibility that the vacuum processing to the wafer W may be performed in the condition where the wafer W is not sufficiently held by the electrostatic chuck 3. This hold checking method to be performed in the wafer loading step will now be described in detail.

(1) Connecting Step in the Hold Checking Method

The shutter 62a of the vacuum chamber 6 is opened to transfer the wafer W held by the transfer pad 70 under suction through the load/unload opening 62 into the vacuum chamber 6 and then position the wafer W directly above the electrostatic chuck 3. Thereafter, the transfer pad 70 is lowered until the front side Wa of the wafer W comes into contact with the holding surface 31a of the electrostatic chuck 3. Thus, the wafer W is placed on the holding surface 31a of the electrostatic chuck 3. As a result, the electrostatic chuck 3 is connected through the wafer W to the transfer pad 70 as depicted in FIG. 3.

(2) Hold Determining Step in the Hold Checking Method

Figure 3:
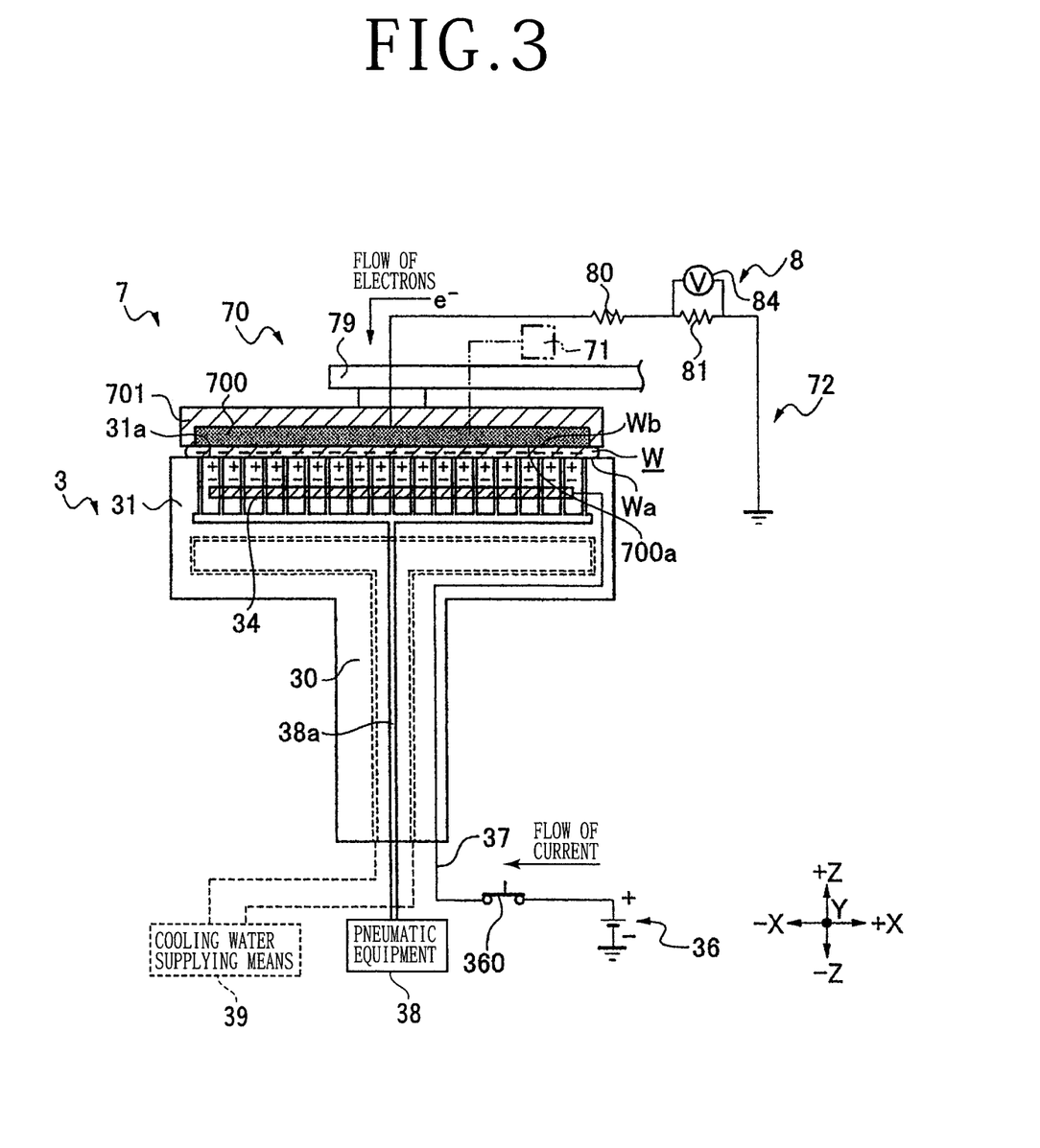
FIG. 3 is a vertical sectional view depicting the condition that a transfer pad is connected through a wafer to an electrostatic chuck and electric power is next supplied from a DC power source to the electrostatic chuck.

After performing the connecting step, a switch 360 for the DC power source 36 is turned on as depicted in FIG. 3 to supply electric power from the DC power source 36 through the first wiring 37 to the electrostatic chuck 3 and thereby apply a predetermined DC voltage (e.g., a DC voltage of 5000 V) to the metal plate 34, so that dielectric polarization occurs between the wafer W and a dielectric layer in the wafer holding portion 31 formed above the metal plate 34. Due to this dielectric polarization, positive (+) charge is concentrated in the vicinity of the holding surface 31a of the wafer holding portion 31. Since the electrostatic chuck 3 and the transfer pad 70 are connected with each other through the wafer W, negative (−) charge is supplied through the second wiring 72 and the conductive suction holding member 700 to the wafer W. Accordingly, the wafer W is negatively charged. As a result, the wafer W is held on the holding surface 31a by an electrostatic force acting between the wafer W and the holding surface 31a.

Figure 4:
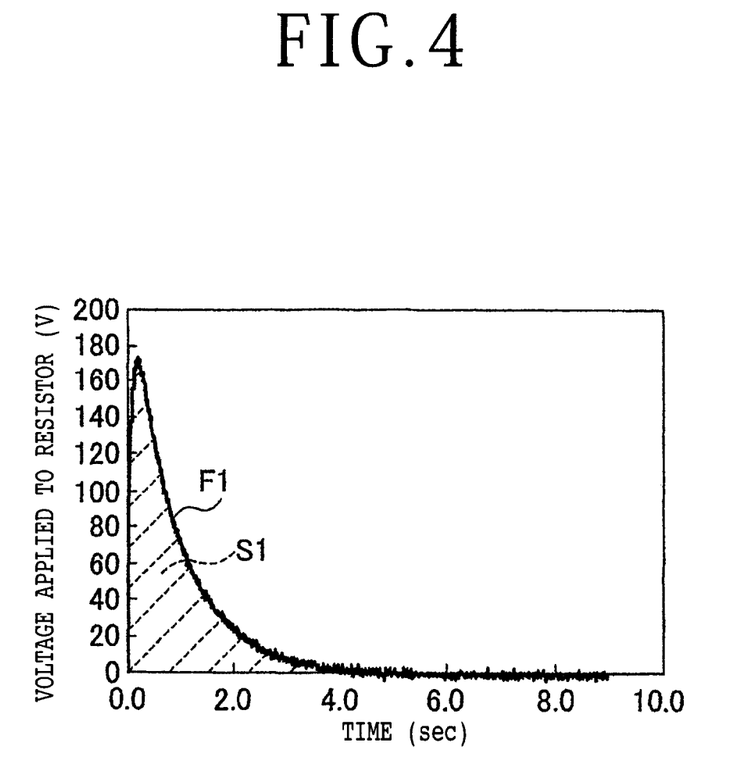
FIG. 4 is a graph depicting a change in voltage across a resistor as measured by a voltmeter when the electric power is supplied from the DC power source to the electrostatic chuck to thereby supply electrical charge to the wafer in a hold determining step.

At this time, a voltage (transient voltage) applied to the resistor 81 of the voltage measuring means 8 in supplying negative charge to the wafer W is measured at both ends of the resistor 81 by using the voltmeter 84. That is, when electric power is supplied from the DC power source 36 through the first wiring 37 to the electrostatic chuck 3 to thereby apply a DC voltage to the resistor 81, a DC current passes through the resistor 81 for a short period of time in accordance with the Ohm's law. As a result, the voltage across the resistor 81 as measured by the voltmeter 84 changes with time as depicted by a graph F1 in FIG. 4. As depicted in FIG. 4, the voltage across the resistor 81 rapidly rises from a steady-state voltage of 0 V to a transient voltage (e.g., 170 V) in a period of approximately 0.3 second. Thereafter, the voltage gradually decreases to restore the steady-stage voltage (0 V) in a period of approximately 3.7 seconds. The integral (the area S1 depicted by broken lines in FIG. 4) of the graph F1 from the time of 0 second to the time of approximately 4.0 seconds indicates the amount of negative charge in the wafer W. When the time duration of approximately 4.0 seconds has elapsed from the time (0 second) of supplying electric power from the DC power source 36 through the first wiring 37 to the electrostatic chuck 3 (i.e., when the transient state where the amount of negative charge in the wafer W changes has elapsed), the wafer W becomes a steady state where the wafer W is sufficiently negatively charged, so that the voltage across the resistor 81 as measured by the voltmeter 84 becomes stable at 0 V. Accordingly, the wafer W is sufficiently held on the holding surface 31a by an electrostatic force acting between the wafer W and the holding surface 31a.

The first determining section 91 of the control section 9 depicted in FIG. 1 previously stores a measured value (e.g., 170 V) for the voltage across the resistor 81 as measured by the voltmeter 84 in the case that the wafer W is sufficiently held on the holding surface 31a of the electrostatic chuck 3 by an electrostatic force. The measured voltage value stored in the first determining section 91 is previously determined according to the size or thickness of the wafer W, and this voltage value objectively indicates the amount of negative charge in the wafer W required for sufficient holding of the wafer W by the electrostatic chuck 3. When the switch 360 for the DC power source 36 is turned on, information on the voltage across the resistor 81 as measured by the voltmeter 84 is transmitted to the first determining section 91 at any time. When the voltage across the resistor 81 as measured by the voltmeter 84 becomes 170 V and the time duration of approximately 3.7 seconds has next elapsed, the first determining section 91 determines that the wafer W has been sufficiently negatively charged and therefore sufficiently held on the holding surface 31a of the electrostatic chuck 3, i.e., determines that the electrostatic holding of the wafer W by the electrostatic chuck 3 has been established. Conversely, when the voltage across the resistor 81 as measured by the voltmeter 84 has not reached 170 V, the first determining section 91 determines that the electrostatic holding of the wafer W by the electrostatic chuck 3 is not sufficient. Thereafter, the first determining section 91 transmits the result of this determination to an operator.

Thus, the hold checking method according to the present invention is composed of the connecting step and the hold determining step. Accordingly, even in the case that the wafer W is loaded to the electrostatic chuck 3 included in the vacuum processing apparatus 1, that is, even in the case that it is difficult for a processing apparatus to determine whether or not the wafer W is sufficiently held by the electrostatic chuck 3, the vacuum processing apparatus 1 according to the present invention can easily determine whether or not the wafer W is sufficiently held by the electrostatic chuck 3.

After confirming that the wafer W is sufficiently held by the electrostatic chuck 3, the operation of the vacuum source 71 is stopped to cancel the suction holding of the wafer W by the suction force applied to the holding surface 700a of the transfer pad 70. After the wafer W is separated from the holding surface 700a of the transfer pad 70, the transfer pad 70 is immediately retracted from the vacuum chamber 6 depicted in FIG. 1. Thereafter, the load/unload opening 62 of the vacuum chamber 6 is closed by the shutter 62a and the evacuating means 64 is next operated to evacuate the vacuum chamber 6. Furthermore, the pneumatic equipment 38 is operated to suck the air left between the front side Wa of the wafer W and the holding surface 31a of the electrostatic chuck 3. Thereafter, the gas discharge head 2 depicted in FIG. 1 is lowered and an etching gas (e.g., $SF_6$) is supplied from the reactant gas supplying source 25 to the gas inlet passage 21a formed in the gas discharge head 2. The etching gas supplied to the gas inlet passage 21a is distributed to the plural gas outlet passages 21b and next uniformly discharged from the openings of the gas outlet passages 21b toward the entire surface of the back side Wb of the wafer W held by the electrostatic chuck 3.

In association with the introduction of the etching gas into the vacuum chamber 6, an RF power is applied from the RF power source 28 to the gas discharge head 2, thereby producing an RF electric field between the gas discharge head 2 and the electrostatic chuck 3 and dissociating the etching gas to form a plasma. The plasma of the etching gas operates to etch the back side Wb of the wafer W. This plasma etching is performed in the condition where the wafer W is sufficiently held by the electrostatic chuck 3, so that there is no possibility of arcing.

After suitably performing the plasma etching to the back side Wb of the wafer W, the application of the RF power to the gas discharge head 2 is stopped and the evacuating means 64 is next operated to evacuate the vacuum chamber 6, thereby removing the etching gas from the evacuation opening 64a of the vacuum chamber 6. Thereafter, the shutter 62a is opened to unload the wafer W from the electrostatic chuck 3 in the vacuum chamber 6 by operating the transfer means 7. At this time, an unhold checking method according to this preferred embodiment is performed to check whether or not the wafer W is electrostatically unheld from the electrostatic chuck 3. That is, the unhold checking method is performed to prevent the possibility that suction holding of the wafer W by the transfer pad 70 may be performed in the condition where the electrostatic holding of the wafer W by the electrostatic chuck 3 has not been sufficiently canceled, causing damage to the wafer W. The unhold checking method to be performed in the wafer unloading step will now be described in detail.

(3) Connecting Step in the Unhold Checking Method

Depicting in FIG. 1, the transfer pad 70 is moved through the load/unload opening 62 to the position directly above the wafer W held by the electrostatic chuck 3, wherein the center of the transfer pad 70 is made to coincide with the center of the wafer W. Thereafter, the transfer pad 70 is lowered until the holding surface 700a of the transfer pad 70 comes into contact with the back side Wb of the wafer W held by the electrostatic chuck 3. As a result, the electrostatic chuck 3 is connected through the wafer W to the transfer pad 70.

(4) Unhold Determining Step in the Unhold Checking Method

Figure 5:
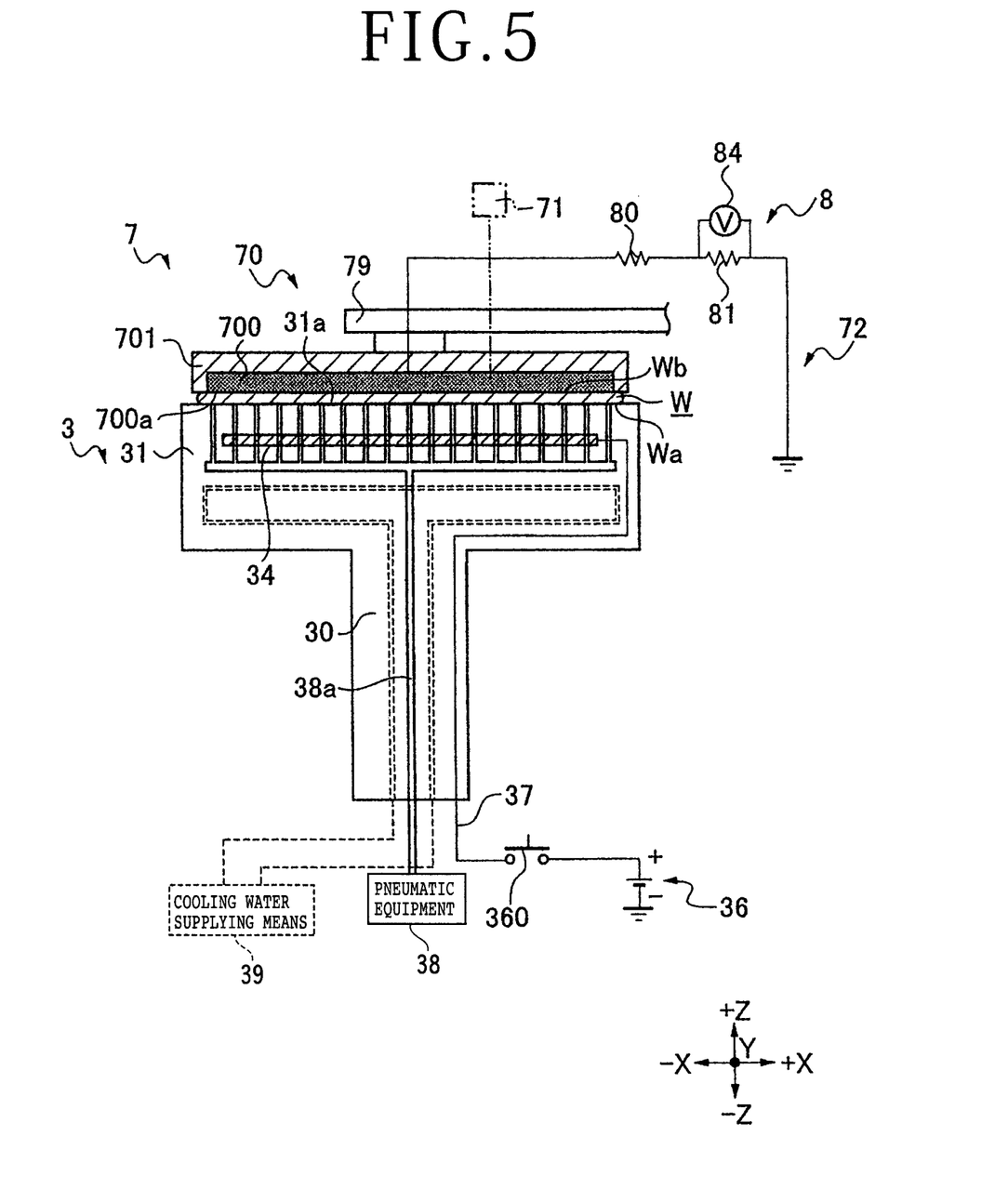
FIG. 5 is a vertical sectional view depicting the condition that the transfer pad is connected through the wafer to the electrostatic chuck and the supply of the electric power from the DC power source to the electrostatic chuck is next stopped.

After performing the connecting step in the unhold checking method, the switch 360 for the DC power source 36 is turned off as depicted in FIG. 5 to stop the supply of the electric power from the DC power source 36 to the electrostatic chuck 3. As a result, the application of the DC voltage from the DC power source 36 to the metal plate 34 is stopped. However, although the supply of current to the metal plate 34 is stopped, the electrical charge near the holding surface 31a of the wafer holding portion 31 does not immediately disappear and the charged condition of the wafer W is not immediately canceled. Accordingly, the electrostatic force remains as a holding force between the holding surface 31a and the wafer W. That is, the electrostatic holding of the wafer W by the electrostatic chuck 3 is not immediately canceled.

Figure 6:
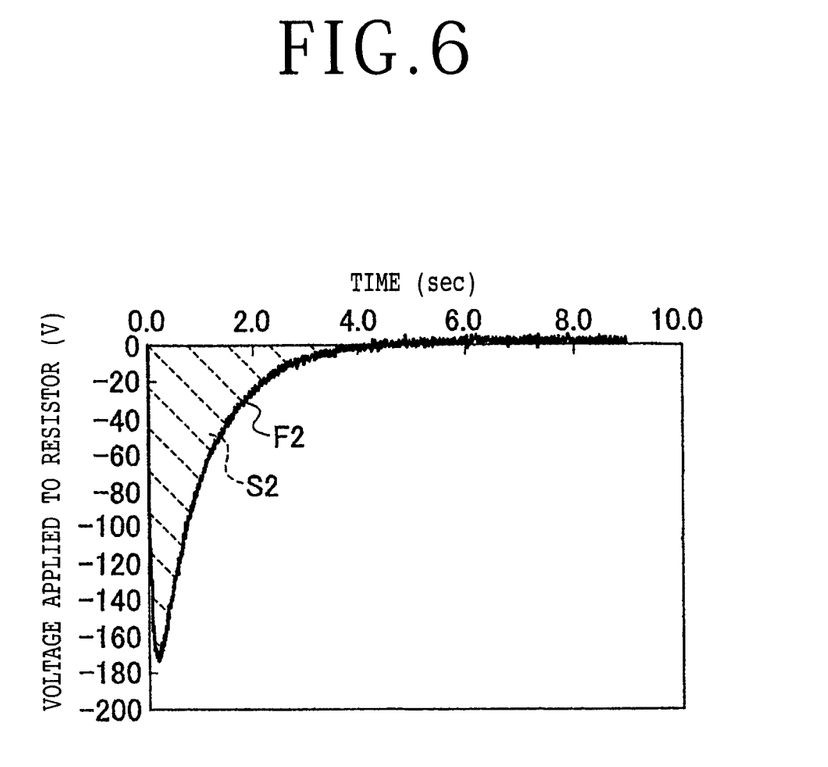
FIG. 6 is a graph depicting a change in voltage across the resistor as measured by the voltmeter when the supply of the electric power from the DC power source to the electrostatic chuck is stopped to thereby remove the electrical charge from the wafer in an unhold determining step.

In the condition where the charged condition of the wafer W is canceled, a voltage (transient voltage) applied to the resistor 81 of the voltage measuring means 8 is measured at both ends of the resistor 81 by using the voltmeter 84. The voltage across the resistor 81 as measured by the voltmeter 84 changes with time as depicted by a graph F2 in FIG. 6. As depicted in FIG. 6, the voltage across the resistor 81 rapidly lowers from a steady-state voltage of 0 V to a transient voltage (e.g., −170 V) in a period of approximately 0.3 second. Thereafter, the voltage gradually increases to restore the steady-state voltage (0 V) in a period of approximately 3.7 seconds. The integral (the area S2 depicted by broken lines in FIG. 6) of the graph F2 from the time of 0 second to the time of approximately 4.0 seconds indicates the amount of negative charge lost from the wafer W. When the time duration of approximately 4.0 seconds has elapsed from the time (0 second) of turning off the switch 360 for the DC power source 36 (i.e., when the transient state where the amount of negative charge decreases has elapsed), the wafer W becomes a steady state where it is not charged, so that the voltage across the resistor 81 as measured by the voltmeter 84 becomes stable at 0 V. Accordingly, the electrostatic force acting between the wafer W and the holding surface 31a is lost to obtain the condition where the wafer W is sufficiently unheld from the holding surface 31a of the wafer holding portion 31 of the electrostatic chuck 3.

The second determining section 92 of the control section 9 depicted in FIG. 1 previously stores a measured value (e.g., −170 V) for the voltage across the resistor 81 as measured by the voltmeter 84 in the case that the wafer W is sufficiently unheld from the holding surface 31a of the electrostatic chuck 3. The measured voltage value stored in the second determining section 92 is previously determined according to the size or thickness of the wafer W, and this voltage value objectively indicates the amount of negative charge removed from the wafer W, which amount is required for sufficient unholding of the wafer W from the electrostatic chuck 3. When the switch 360 for the DC power source 36 is turned off, information on the voltage across the resistor 81 as measured by the voltmeter 84 is transmitted to the second determining section 92 at any time. When the voltage across the resistor 81 as measured by the voltmeter 84 becomes −170 V and the time duration of approximately 3.7 seconds has next elapsed, the second determining section 92 determines that the negative charge has been sufficiently removed from the wafer W and therefore the wafer W is sufficiently unheld from the holding surface 31a of the electrostatic chuck 3, i.e., determines that the electrostatic holding of the wafer W by the electrostatic chuck 3 has been canceled. Conversely, when the voltage across the resistor 81 as measured by the voltmeter 84 has not reached −170 V, the second determining section 92 determines that the wafer W is not sufficiently unheld from the holding surface 31a of the electrostatic chuck 3, i.e., determines that the electrostatic holding of the wafer W by the electrostatic chuck 3 has not been canceled. Thereafter, the second determining section 92 transmits the result of this determination to the operator.

Thus, the unhold checking method according to the present invention is composed of the connecting step and the unhold determining step. Accordingly, even in the case that the wafer W is unloaded from the electrostatic chuck 3 included in the vacuum processing apparatus 1, that is, even in the case that it is difficult for a processing apparatus to determine whether or not the wafer W is sufficiently unheld from the electrostatic chuck 3, the vacuum processing apparatus 1 according to the present invention can easily determine whether or not the wafer W is sufficiently unheld from the electrostatic chuck 3.

After confirming that the wafer W is sufficiently unheld from the electrostatic chuck 3, the pneumatic equipment 38 is operated to supply pressurized air to the holding surface 31a of the electrostatic chuck 3, thereby pushing up the wafer W from the holding surface 31a by using a jet of pressurized air. This operation of the pneumatic equipment 38 is performed to remove the suction force acting between the holding surface 31a of the electrostatic chuck 3 and the wafer W. Thereafter, the vacuum source 71 is operated to apply a vacuum to the holding surface 700a of the transfer pad 70, thereby sucking the wafer W from the holding surface 31a of the electrostatic chuck 3 and holding the wafer W on the holding surface 700a of the transfer pad 70 under suction. Thus, the wafer W is reliably unloaded from the electrostatic chuck 3. Since the electrostatic holding of the wafer W by the electrostatic chuck 3 has been sufficiently canceled, there is no possibility that the wafer W may be damaged in raising the transfer pad 70 holding the wafer W.

The vacuum processing apparatus 1 according to the present invention is not limited to the above preferred embodiment. Further, the size, shape, etc. of each component of the apparatus 1 are not limited to those depicted in the attached drawings, but may be suitably changed within the scope where the effect of the present invention can be exhibited. For example, in the case that a protective tape is attached to the wafer W and that the wafer W is held through the protective tape on the holding surface 31a of the electrostatic chuck 3, the metal plate 34 may be exposed to the holding surface 31a of the electrostatic chuck 3 because the protective tape is formed of a dielectric.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. In a vacuum processing apparatus including
an electrostatic chuck including a wafer holding portion having a holding surface formed of a dielectric for holding a wafer, a metal plate provided in the wafer holding portion, and first wiring for connecting the metal plate to a direct current power source,
transfer means including a transfer pad having a holding surface formed of a conductor for holding the wafer and second wiring for grounding the transfer pad, and
voltage measuring means having a resistor inserted in the second wiring and a voltmeter for measuring a voltage across the resistor,
a hold checking method for checking whether or not the wafer is held by the electrostatic chuck in loading the wafer to the electrostatic chuck by operating the transfer means holding the wafer, the hold checking method comprising:
a connecting step of bringing the wafer held by the transfer pad into contact with the electrostatic chuck to thereby connect the transfer pad through the wafer to the electrostatic chuck; and
a hold determining step of supplying electric power from the direct current power source to the electrostatic chuck through the first wiring after performing the connecting step, and next determining that the wafer is sufficiently held on the holding surface of the electrostatic chuck when the voltage across the resistor in the second wiring as measured by the voltmeter has reached a predetermined voltage value and after an elapse of a predetermined time from a start of the supplying of the electric power to the electrostatic chuck.

2. The hold checking method of claim 1, wherein the predetermined time is a length of time for the voltage across the resistor to reach the predetermined voltage value from zero voltage and back to zero voltage from the predetermined voltage value.

3. In a vacuum processing apparatus including
an electrostatic chuck including a wafer holding portion having a holding surface formed of a dielectric for holding a wafer, a metal plate provided in the wafer holding portion, and first wiring for connecting the metal plate to a direct current power source, transfer means including a transfer pad having a holding surface formed of a conductor for holding the wafer and second wiring for grounding the transfer pad, and voltage measuring means having a resistor inserted in the second wiring and a voltmeter for measuring a voltage across the resistor, an unhold checking method for checking whether or not the wafer is unheld from the electrostatic chuck in unloading the wafer from the electrostatic chuck by operating the transfer means holding the wafer, the unhold checking method comprising:

a connecting step of bringing the transfer pad into the wafer held by the electrostatic chuck to thereby connect the transfer pad through the wafer to the electrostatic chuck; and an unhold determining step of stopping the supply of electric power from the direct current power source to the electrostatic chuck through the first wiring after performing the connecting step, and next determining that the wafer is sufficiently unheld from the holding surface of the electrostatic chuck when the voltage across the resistor in the second wiring as measured by the voltmeter has reached a predetermined voltage value and after an elapse of a predetermined time from the stopping of the supply of the electric power to the electrostatic chuck.

4. The unhold checking method of claim 3, wherein the predetermined time is a length of time for the voltage across the resistor to reach the predetermined voltage value from zero voltage and back to zero voltage from the predetermined voltage value.

* * * * *